United States Patent [19]

Buser et al.

[11] 4,259,636

[45] Mar. 31, 1981

[54] MONITORING DEVICE FOR SEMICONDUCTOR RECTIFIERS

[75] Inventors: Werner Buser, Basel; Hendrik Hoitink, Windisch, both of Switzerland

[73] Assignee: BBC Brown, Boveri & Company, Limited, Baden, Switzerland

[21] Appl. No.: 973,929

[22] Filed: Dec. 28, 1978

[30] Foreign Application Priority Data

Jan. 4, 1978 [CH] Switzerland ............................. 68/78

[51] Int. Cl.³ ...................... G01R 31/22; G08B 21/00
[52] U.S. Cl. ................................. 324/158 D; 340/645; 361/88; 363/53; 363/54
[58] Field of Search .................... 324/158 D; 340/645; 361/42, 48, 44, 47, 50, 88, 89; 363/52, 53, 54, 126

[56] References Cited

U.S. PATENT DOCUMENTS 4,133,017  1/1979  Johnson et al. ...................... 340/645

FOREIGN PATENT DOCUMENTS 237997  7/1969  U.S.S.R. ................................. 340/645

*Primary Examiner*—Ernest F. Karlsen
*Attorney, Agent, or Firm*—Oblon, Fisher, Spivak, McClelland & Maier

[57] ABSTRACT

A monitoring device for semiconductor rectifiers which are located in a three-phase current bridge circuit, in which the bridge circuit is provided with two semiconductor rectifiers per rectifier branch, including a current-sensitive detector circuit connected to each pair of semiconductor rectifiers of each branch through a resistor, wherein when the semiconductor rectifiers are intact, the sum of all current flowing through the resistors is zero, as detected by the current-sensitive detector circuit.

5 Claims, 7 Drawing Figures

MONITORING DEVICE FOR SEMICONDUCTOR RECTIFIERS

BACKGROUND OF THE INVENTION

1. Field of the Invention

This invention concerns a monitoring device for semiconductor rectifiers which are arranged in a three-phase current bridge circuit.

2. Discussion of the Prior Art

A method is known by which, with several diodes parallel connected over fuses and installed on the rotor of an electrical machine, safety indicators are observed by means of a stroboscope when the machine is in operation.

A device developed by the Applicant leads each diode circuit over a special groove of the rotor. In this case, several diodes are parallel connected over fuses. Special interrogation coils are provided on the side of the stator, in which in the case of passing, if the diodes are intact, tensions are induced, which are evaluated in a corresponding device. In the case of short circuit of a diode (defective fuse) or in the case of an interruption, no tension is produced in the corresponding interrogation coil, which makes possible a clear break-down indication (Brochure "Monitoring of Rotating Rectifiers" Type "Urga", BBC 1970, DC 95055, pr-D).

However, these known methods have disadvantages. The observation of the safety indicators on rotating machines by means of the stoboscope is time consuming and only permits a periodic check. It is true that the process has been used for several years for large machines satisfies most requirements, but it is expensive, and results in added expense on the part of the machine.

SUMMARY OF THE INVENTION

Accordingly, it is the object of this invention to avoid the disadvantages of the known solutions.

This and other objects are by the fact that the bridge circuit in a known manner contains two semiconductor rectifiers per rectifier branch and that from each pair of semiconductor rectifiers, resistors of equal size lead to a current-sensitive detector circuit, in which case, when the semiconductor rectifiers are intact, the sum of all currents flowing through the resistors is zero.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
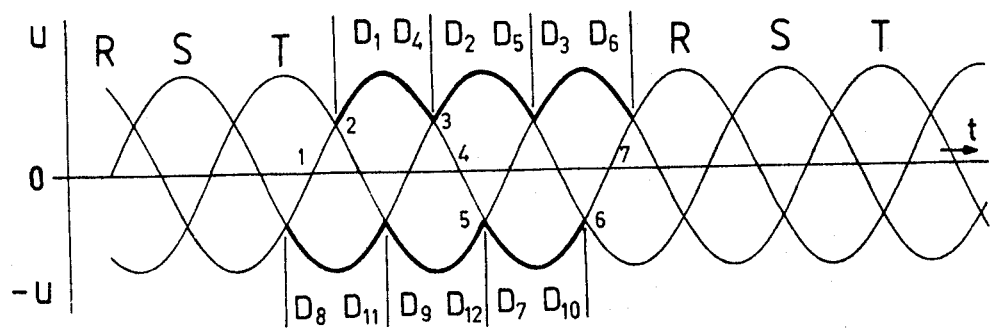
FIG. 1 is a graph of input waveforms to the circuit of the invention shown in FIG. 2.

Referrring now to the drawings, wherein like reference numerals designate identical or corresponding parts throughout the several views, and more particularly to FIG. 1 thereof, it is seen that the bridge according to the invention is supplied by the three phases R, S, T of a three-phase current generator grounded at the neutral point. The rectifier branches consist of series-pairs of diodes $(D_1, D_4)$, $(D_2, D_5)$ etc. The diodes that do not face points R, S, T of each pair are added for reasons of redundancy. $R_1$ is a ballast resistor, and U is the voltage amplitude at the three-phase current generator.

The connecting points $P_1 \ldots P_6$ of the diodes of each pair of diodes are now, through resistors of equal size $R_1 \ldots R_6$, connected with the current-sensitive detector circuit SD. Thus, the sum current $I_1 + I_2 \ldots + I_6 = I_S$ appears at the input of SD. The designation A is the output of the detector.

Figure 3:
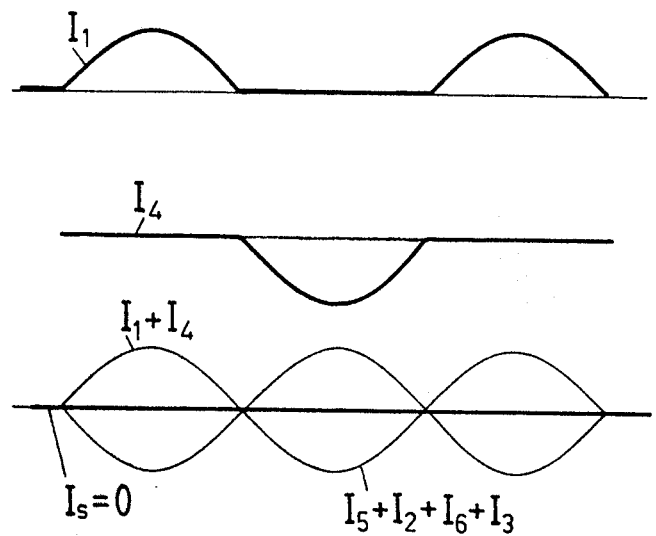
FIG. 3 is a graph of current waveforms of the circuit shown in FIG. 2, assuming the case of intact diodes.

The exact method of operation will now, with reference to FIG. 1, be shown by means of the example of intact diodes. The anode of the diode $D_1$ at $t=1$ becomes positive in regard to the neutral point (zero potential) which causes a current through the resistor $R_1$. Point $P_1$ follows the positive half wave to the time $t=4$. From $t=2$ to $t=3$, the diode $D_4$ is also conducting (forward flow angle phase R). During the negative half wave of phase R, the diode $D_{10}$ is conducting from $t=4$ to $t=7$, and from $t=5$ to $t=6$ also $D_7$. The sum of the current flowing through $R_1 + R_4$ is therefore U/R, where $R_1 = R_2 = \ldots = R_6 = R$. The method of operation of the circuits for phase S and T is identical. Since the currents $I_1 + I_4$, $I_5 + I_2$, $I_6 + I_3$ in the phase position are located at 120° in regard to each other and are added vectorially, the sum current $I_S$ flowing into the current detector becomes equal to zero. FIG. 3 shows the course of the currents in the case of intact diodes.

Figure 4:
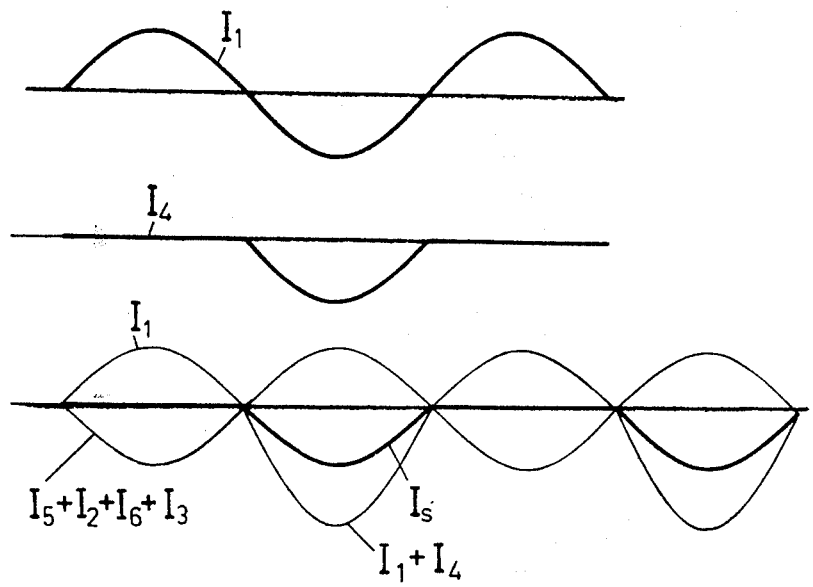
FIG. 4 is a graph of current waveforms of the circuit shown in FIG. 2, assuming a short-circuited diode $D_1$.
Figure 5:
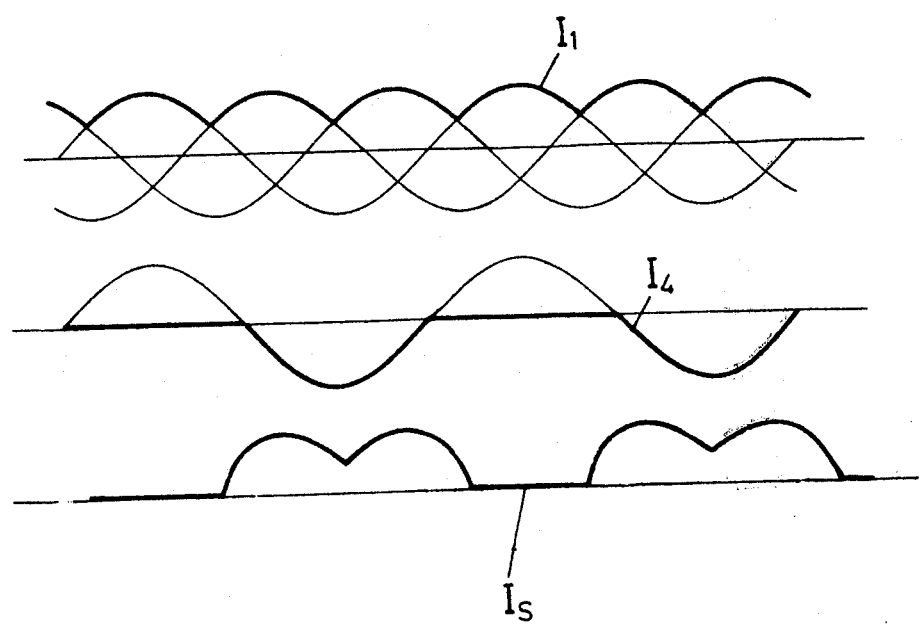
FIG. 5 is a graph of current waveforms of the circuit shown in FIG. 2, assuming a short-circuited diodes $D_4$.

FIG. 4 shows the situation in the case of a short-circuited diode $D_1$. The result is a negative half-wave current which can be registered by the current detector and can be evaluated as a break-down indication. FIG. 5 shows the course of the current in the case of a short-circuit of diode $D_4$. The resulting positive sum current in this case has a more complicated course. As shown in the diagrams, the result, even in the case of a simultaneous occurrence of a short circuit of $D_1$ and $D_4$, is a sum current that is greater than zero.

The above considerations also apply to phases S and T. The described arrangement will furnish a sum current until the breakdown of all redundant diodes (one short-circuited element per rectifier branch).

The arrangement according to the invention can also, without difficulty be used for other types of semiconductor rectifiers, for example, thyristors.

Figure 6:
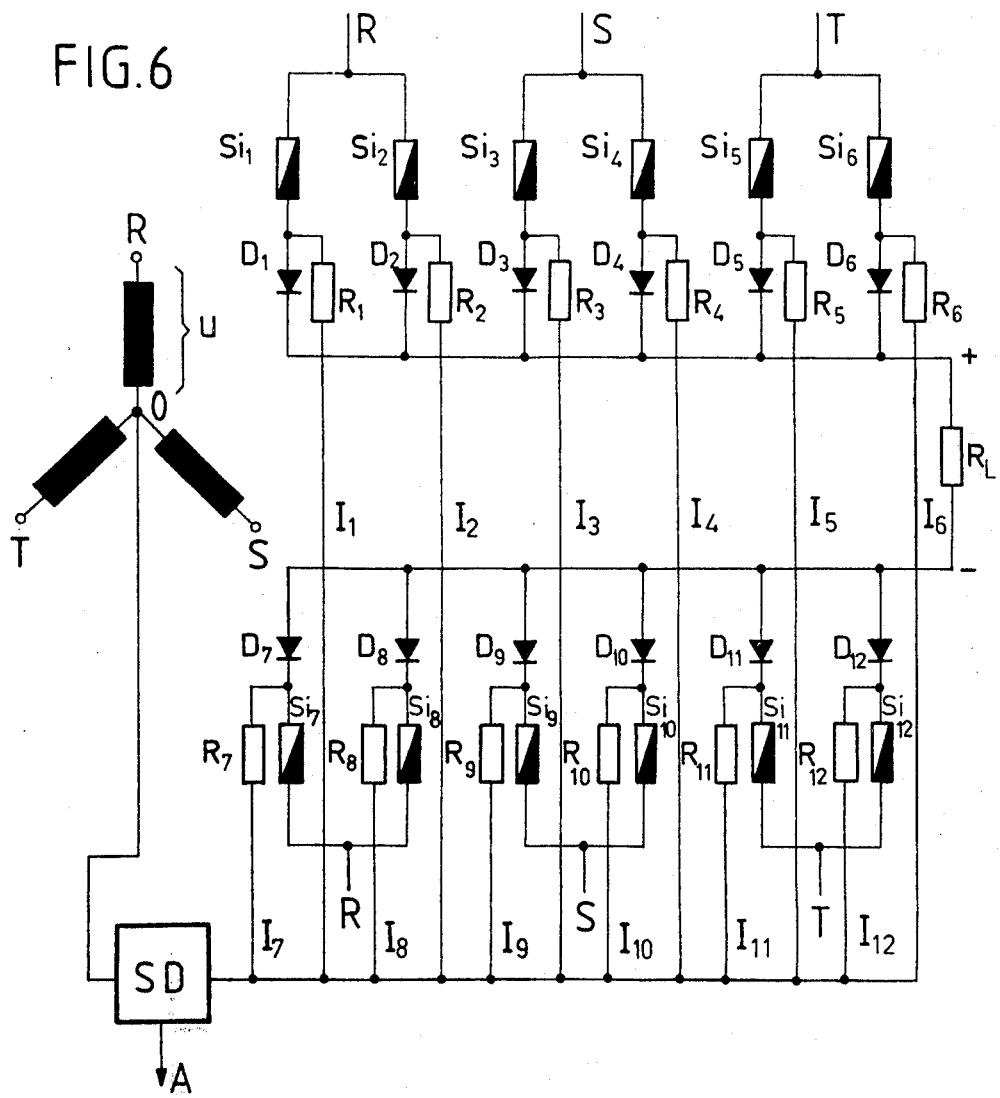
FIG. 6 is a circuit diagram of another embodiment of the invention employing two semiconductor diode rectifiers per branch of rectifiers parallel connected over fuses.
Figure 7:
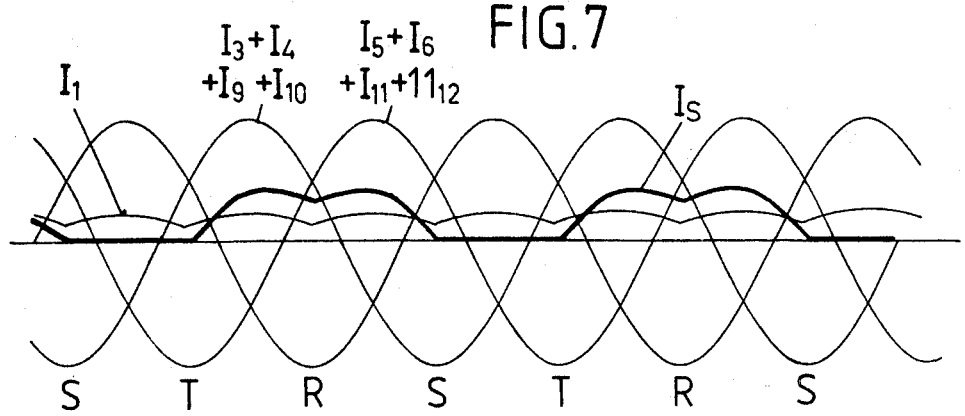
FIG. 7 is a graph of current waveforms of the circuit of FIG. 6, assuming a short-circuited $D_1$ and an interruption of $Si_1$.

FIG. 6 shows a circuit, in the case of which two semiconductor rectifiers per branch of rectifiers, here diodes, are parallel-connected over fuses. In this case also, in the case of intact diodes and fuses, the sum current resulting from the currents $I_1$ to $I_{12}$ is zero. In the case of a defective fuse, for example, because of short-circuit of the associated diode, the balance of the currents is disturbed which results in an indication of a sum current. FIG. 7 shows the time-related course of the currents based on the example of a short circuit of $D_1$ and the interruption of $Si_1$.

Until there is a simultaneous defect of 11 fuses, this circuit will supply a sum current $I_S$ greater than zero. It is also possible to use more than two diodes per rectifier branch which are parallel-connected over fuses (increase of the redundancy and/or of the current-carrying capacity per rectifier branch). For each additional diode-fuse combination, a detecting element resistor R must also be provided.

The circuit may also be modified so that the diodes and fuses are interchanged among each other.

Figure 2:
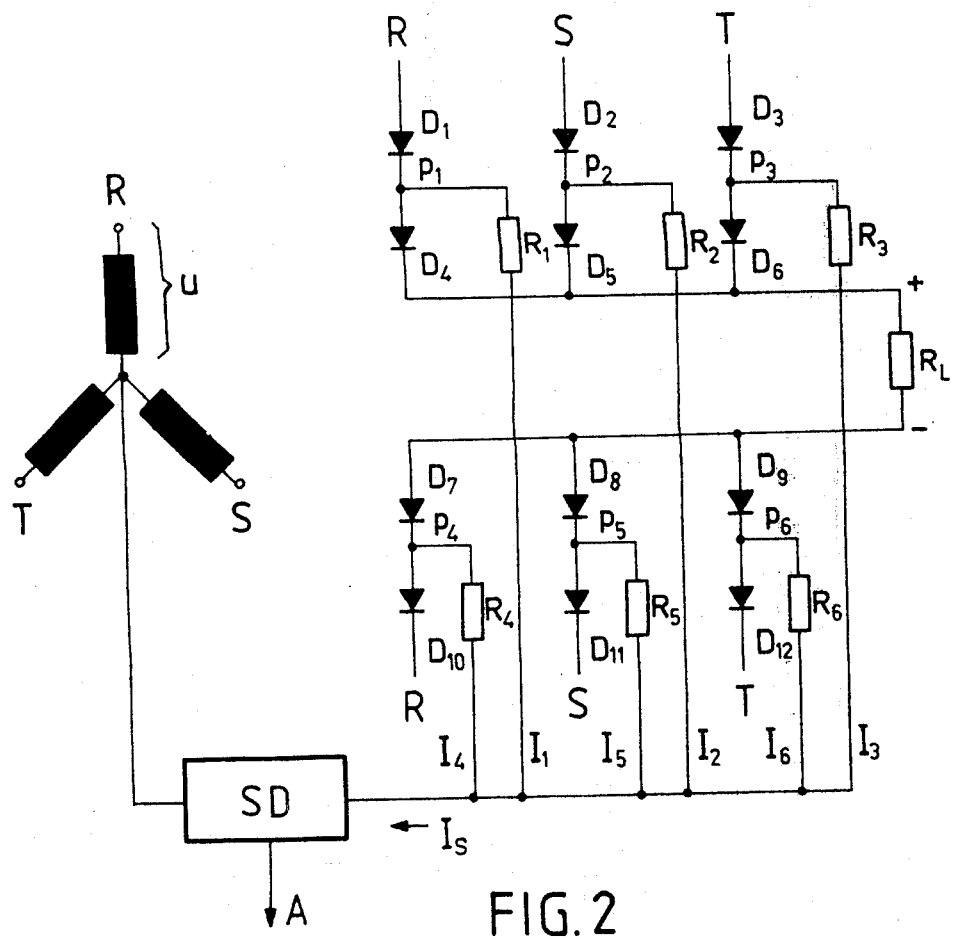
FIG. 2 is a circuit diagram of a diode three-phase current bridge according to one embodiment of the invention.

In contrast to the circuit arrangement according to FIG. 2, in which the detecting element resistors R must be of such low resistance that the currents affected by them clearly differ from the inverse currents of the diodes, resistors with much higher resistances may be used in the case of this circuit which causes a smaller power loss. On the other hand, in the case of the circuit according to FIG. 6, an additional fuse is required per diode.

The principle according to the invention is especially well suited for the monitoring of the diodes of the energizing circuit of a generator or motor without a slip ring. The diodes and the detecting element resistors R as well as the current detector are located on the rotor. The current change, over a rotary transmitter, is transmitted to the stationary part of the machine and is evaluated and indicated by an electronic evaluation system which partly monitors itself.

Obviously, numerous additional modifications and variations of the present invention are possible in light of the above teachings. It is therefore to be understood that within the scope of the appended claims, the invention may be practiced otherwise than as specifically described herein.

What is claimed new and desired to be secured by Letters Patent of the United States is:

1. A monitoring device for semiconductor rectifiers, which are located in a three-phase current bridge circuit connected to a three-phase power source, comprising:

said bridge circuit comprising a plurality of rectifier branches, each branch having at least two pairs of semiconductor rectifiers per phase connected in series between a respective phase and a load, each pair having a series connection point to which is connected one side of a respective resistor, each resistor having a common value and the other sides thereof tied together at a common point to allow vector addition of all the currents flowing through said resistors; and a current sensitive detector coupled to said common point for detecting if said vector current is non-zero;

wherein, when the semiconductor rectifiers are intact, the vector sum of all current flowing through the resistors is zero, as detected by said current sensitive detector circuit.

2. A monitoring device according to claim 1, further comprising:

the semiconductor rectifiers of each pair connected in series with one fuse element each and, in parallel fashion, series-connected to the three-phase power phases; and, the connecting point of each rectifier and it's associated series-connected fuse connected through said resistor to the input of said current sensitive detector circuit.

3. A monitoring device according to claim 2, further comprising:

at least one other series circuit of a semiconductor rectifier and a fuse, connected in parallel with the semiconductor rectifiers and fuses of each pair.

4. A monitoring device according to claim 1, wherein the semiconductor rectifiers are diodes.

5. A monitoring device according to claim 1, wherein the semiconductor rectifiers are thyristors.

* * * * *